United States Patent
Liu et al.

(10) Patent No.: US 10,752,995 B2
(45) Date of Patent: Aug. 25, 2020

(54) MATERIAL DELIVERY SYSTEM AND METHOD

(71) Applicant: Taiwan Semiconductor Manufacturing Company, Ltd., Hsinchu (TW)

(72) Inventors: Ke-Chih Liu, Hsinchu (TW); Chia-Ming Tsai, Zhubei (TW); Yen-Yu Chen, Taichung (TW); Yueh-Ching Pai, Taichung (TW); Yu-Min Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 565 days.

(21) Appl. No.: 15/442,467

(22) Filed: Feb. 24, 2017

(65) Prior Publication Data

US 2017/0167027 A1    Jun. 15, 2017

Related U.S. Application Data

(62) Division of application No. 13/269,372, filed on Oct. 7, 2011, now abandoned.

(51) Int. Cl.
| C23C 16/52 | (2006.01) |
| H01L 21/02 | (2006.01) |
| C23C 16/448 | (2006.01) |
| H01L 21/67 | (2006.01) |
| C23C 16/46 | (2006.01) |
| H01L 21/66 | (2006.01) |

(52) U.S. Cl.
CPC .......... *C23C 16/52* (2013.01); *C23C 16/4481* (2013.01); *C23C 16/4482* (2013.01); *C23C 16/46* (2013.01); *H01L 21/02104* (2013.01); *H01L 21/67248* (2013.01); *H01L 22/12* (2013.01)

(58) Field of Classification Search
CPC . C23C 16/52; C23C 16/4481; C23C 16/4482; C23C 16/46; H01L 21/02104; H01L 21/67248; H01L 21/22; H01L 21/12
USPC ........................................... 392/441
See application file for complete search history.

(56) References Cited

U.S. PATENT DOCUMENTS

| 4,869,097 | A | 9/1989 | Tittmann et al. |
| 6,182,514 | B1 | 2/2001 | Hodges |
| 7,087,118 | B2 | 8/2006 | Kitano et al. |
| 7,562,672 | B2 | 7/2009 | Nakashima et al. |
| 7,597,758 | B2 | 10/2009 | Chen et al. |
| 7,706,671 | B2 | 4/2010 | Brown |
| 7,735,452 | B2 | 6/2010 | Spartz |
| 7,813,627 | B2 * | 10/2010 | Sarigiannidis ............ F17C 5/06 219/486 |
| 2001/0053587 | A1 * | 12/2001 | Pyo .......................... C23C 4/123 438/496 |

(Continued)

*Primary Examiner* — Brian W Jennison
(74) *Attorney, Agent, or Firm* — Slater Matsil, LLP

(57) ABSTRACT

A method includes applying a first amount of heat to a vapor region of a precursor canister, measuring an indication of saturated vapor pressure within the vapor region during the applying the first amount of heat, and applying a second amount of heat to the vapor region of the precursor canister, the second amount of heat being adjusted from the first amount of heat based on the indication of saturated vapor pressure.

20 Claims, 4 Drawing Sheets

(56) References Cited

U.S. PATENT DOCUMENTS

| | | | |
|---|---|---|---|
| 2002/0104481 A1* | 8/2002 | Chiang | C23C 16/0227 |
| | | | 118/723 I |
| 2004/0084081 A1* | 5/2004 | Liu | G05D 11/132 |
| | | | 137/113 |
| 2005/0223989 A1 | 10/2005 | Lee et al. | |
| 2006/0154377 A1 | 7/2006 | Lambert et al. | |
| 2006/0283354 A1* | 12/2006 | Shinoda | C01G 23/005 |
| | | | 106/287.18 |
| 2007/0280722 A1 | 12/2007 | Katada et al. | |
| 2008/0216743 A1* | 9/2008 | Chen | C23C 16/18 |
| | | | 118/719 |
| 2008/0279736 A1 | 11/2008 | Frinke et al. | |
| 2009/0232986 A1* | 9/2009 | Choi | C23C 16/4481 |
| | | | 427/255.28 |
| 2010/0285206 A1 | 11/2010 | Woelk et al. | |
| 2010/0300357 A1 | 12/2010 | Yamamoto et al. | |
| 2012/0037075 A1 | 2/2012 | Pei | |

* cited by examiner

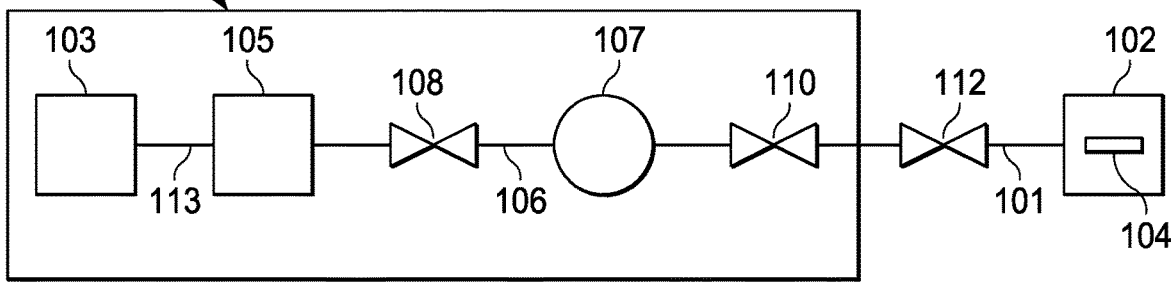
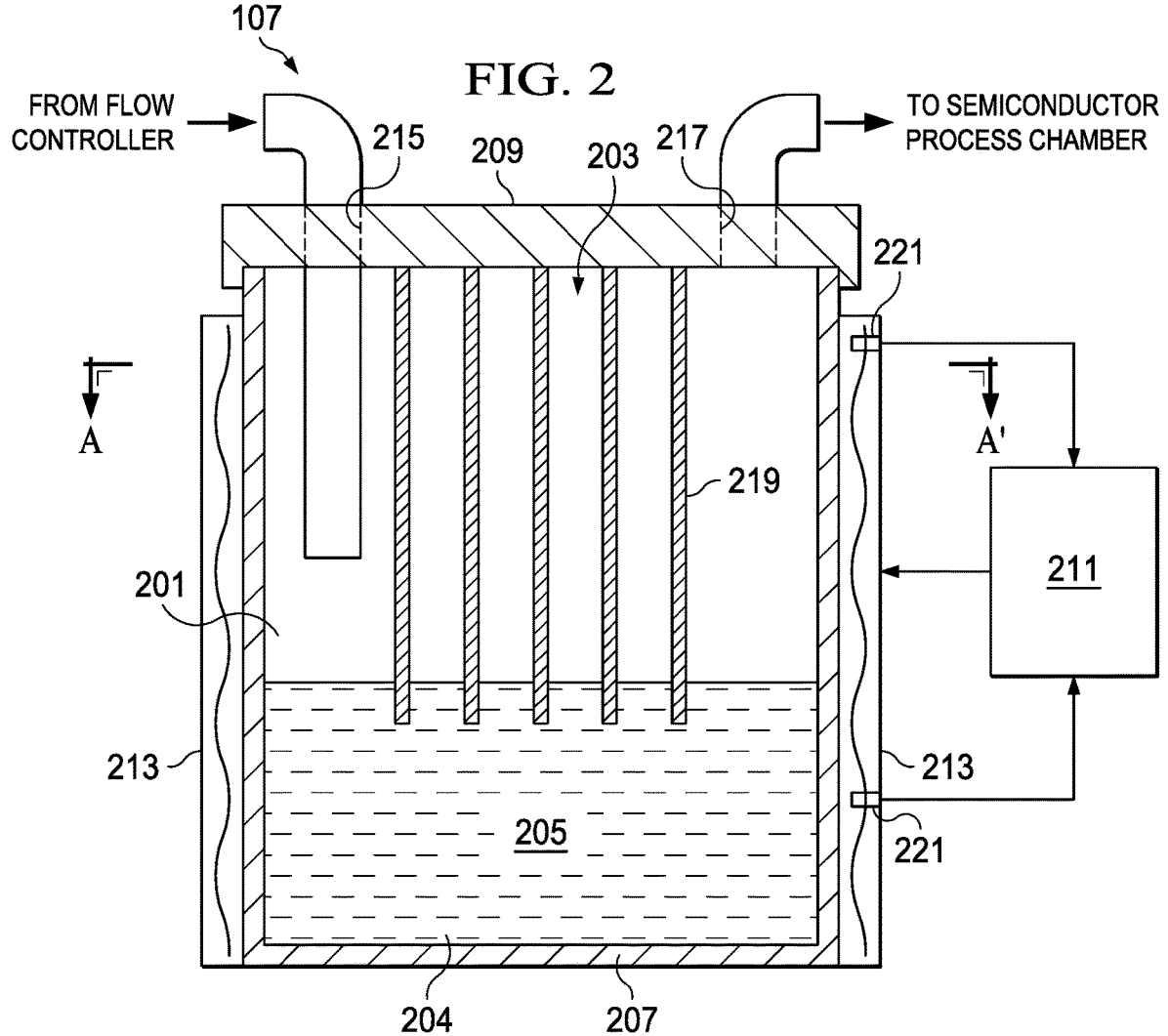

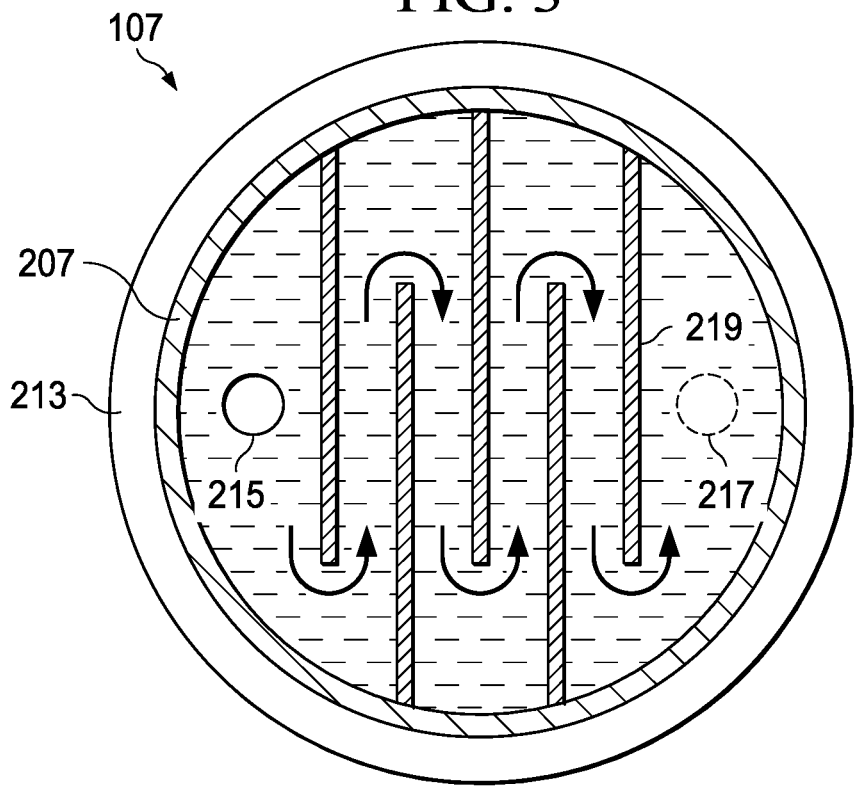
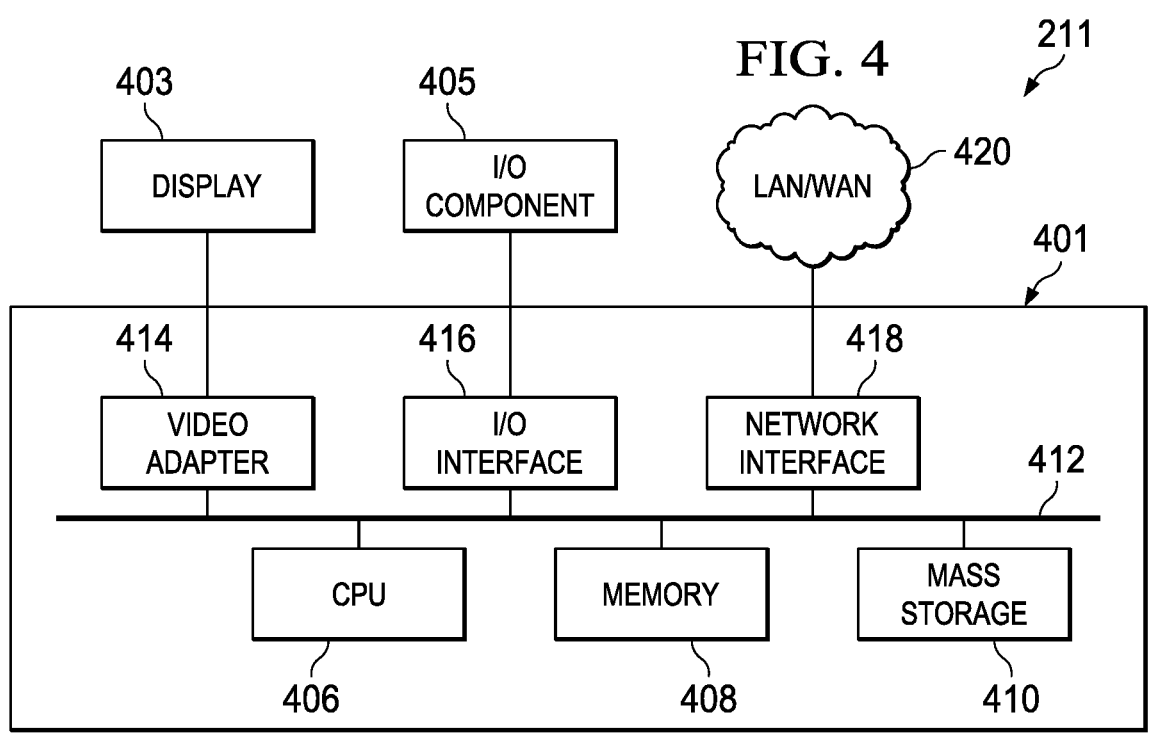

MATERIAL DELIVERY SYSTEM AND METHOD

PRIORITY CLAIM AND CROSS-REFERENCE

This application is a divisional application and claims the benefit of U.S. patent application Ser. No. 13/269,372, filed Oct. 7, 2011, entitled "Material Delivery System and Method," which application is incorporated herein by reference in its entirety.

BACKGROUND

Often, semiconductor manufacturing processes utilize precursor materials in a gaseous phase as part of the manufacturing process. However, these precursor materials may arrive at the semiconductor manufacturer in various forms, such as liquid raw materials or even solid raw materials. To use these liquid or solid raw materials in the actual manufacturing processes, these raw materials may need to be changed into a gaseous phase in order to be properly controlled and delivered to the various processing chambers where they can react or otherwise be utilized in the semiconductor manufacturing process.

In order to achieve the gaseous forms, the solid or liquid raw materials may be placed into a raw material canister. Once in the raw material canister the raw material may begin to change phase into a gaseous form based in part on the material's equilibrium between itself and an overlying ambient. One such measure of equilibrium is the raw material's saturated vapor pressure, which is dependent at least in part on the temperature of the material within the raw material canister. When in use, the raw material within the raw material canister may be heated until the raw material meets the desired saturated vapor pressure based upon an equation of the raw material's saturated vapor pressure and temperature. The heating may be performed, for example, using heating elements.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a precursor delivery system with a precursor canister in accordance with an embodiment;

FIG. 2 illustrates a cross sectional view of the precursor canister in accordance with an embodiment;

FIG. 3 illustrates top down view of the precursor canister in accordance with an embodiment;

FIG. 4 illustrates a controller that may be used to control the temperature within the precursor canister in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 5A:
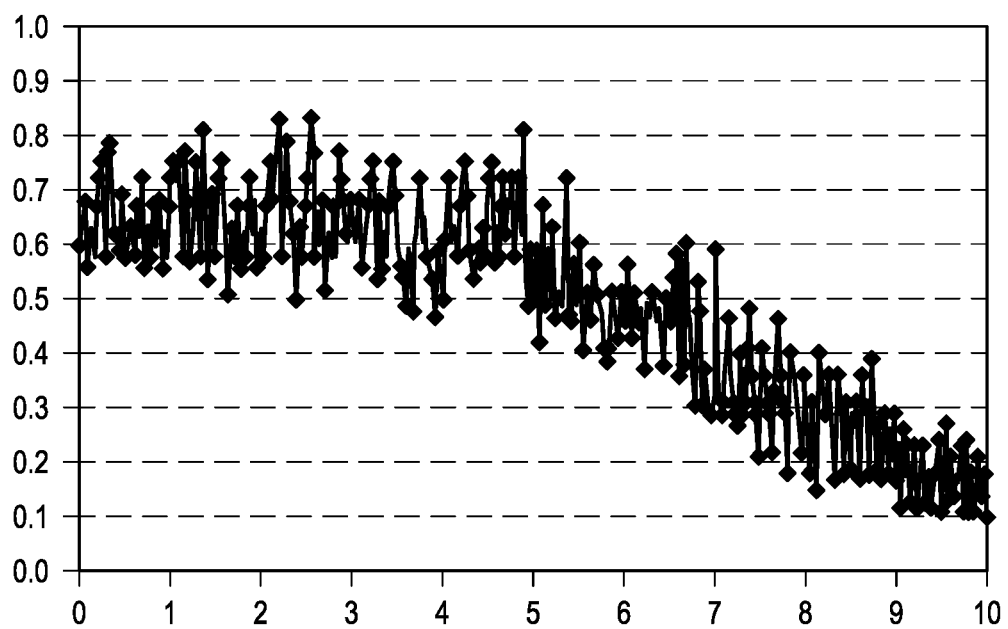
FIGS. 5A-5B illustrates calibration curves that the controller may use to control the temperature of the precursor canister in accordance with an embodiment.

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a precursor canister for a semiconductor manufacturing process. The embodiments may also be applied, however, to other precursor delivery systems.

With reference now to FIG. 1, there is shown a precursor delivery system 100 that may be used to deliver precursor materials to a semiconductor processing chamber 102. The semiconductor processing chamber 102 may be a chamber utilized to deposit materials onto a semiconductor wafer 104. In a particular embodiment, the semiconductor processing chamber 102 may be utilized in an atomic layer deposition (ALD) process to form a layer of tantalum nitride (TaN—not individually shown separate from the semiconductor wafer 104) onto the semiconductor wafer 104.

In an ALD process thin films such as the layer of TaN may be formed on the semiconductor wafer 104 using a self-limiting process, such that atomic layers of material are deposited sequentially using a series of pulses of precursor materials. For example, a first precursor may be introduced into the semiconductor processing chamber 102 and a layer of this first precursor may be adsorbed and reacted onto the semiconductor wafer 104. Excess first precursor may be pumped out and a second precursor may be introduced to react with the first precursor on the semiconductor wafer 104 to form a monolayer of the desired material (e.g., the layer of TaN) via a self-limiting reaction. This process may be repeated to build up successive monolayers until a desired thickness is achieved.

However, as one of ordinary skill in the art will recognize, the ALD process to form the layer of TaN is merely an illustrative example of a process that may utilize the semiconductor processing chamber 102. Other processes that utilize precursor materials may be performed in the semiconductor processing chamber 102, such as chemical vapor deposition (CVD), physical vapor deposition (PVD), various types of etching processes, combinations of these, or the like, may alternatively be utilized. These processes and any other process that utilizes gaseous phase precursor materials may alternatively be performed within the semiconductor processing chamber 102, and all such processes are fully intended to be included within the scope of the embodiments.

The precursor delivery system 100 supplies the desired precursor materials to the semiconductor processing chamber 102 through a final delivery line 101. The precursor delivery system 100 may also help to control the rate of delivery and pressure of the semiconductor processing chamber 102 by controlling the inflow of gas through the final delivery line 101. Furthermore, while only a single precursor delivery system 100 is illustrated in FIG. 1, this is done for simplicity, as more than one precursor delivery system 100 may be attached to the semiconductor processing chamber 102 in order to provide the different number and types of precursor materials desired for the desired process.

In an embodiment the precursor delivery system 100 may include a carrier gas supply 103, a flow controller 105, and a precursor canister 107. The carrier gas supply 103 may supply a gas that may be used to help "carry" the precursor gas to the semiconductor processing chamber 102. The carrier gas may be an inert gas or other gas that does not react with the precursor material or other materials within the system. For example, the carrier gas may be helium (He), argon (Ar), nitrogen ($N_2$), hydrogen ($H_2$), combinations of these, or the like, although any other suitable carrier gas may alternatively be utilized.

The carrier gas supply 103 may be vessel, such as a gas storage tank, that is located either locally to the semiconductor processing chamber 102 or remotely from the semiconductor processing chamber 102. Alternatively, the carrier gas supply 103 may be a facility that independently prepares and delivers the carrier gas to the flow controller 105 of the precursor delivery system 100 and elsewhere, such as other precursor delivery systems (not separately shown). Any suitable source for the carrier gas may be utilized as the carrier gas supply 103, and all such sources are fully intended to be included within the scope of the embodiments.

The carrier gas supply 103 may supply the desired carrier gas to the flow controller 105 through a first line 113. The flow controller 105 may be utilized to control the flow of the carrier gas to the precursor canister 107 and to the semiconductor processing chamber 102, thereby helping to control the pressure within the semiconductor processing chamber 102. The flow controller 105 may be, e.g., a proportional valve, a modulating valve, a needle valve, a pressure regulator, a mass flow controller, combinations of these, or the like. However, any suitable method for controlling and regulating the flow of the carrier gas to the semiconductor processing chamber 102 may be utilized, and all such methods are fully intended to be included within the scope of the embodiments. In an embodiment the carrier gas supply 103 may control the flow of carrier gas to between about 100 sccm and about 1300 sccm, such as about 800 sccm.

The flow controller 105 may supply the controlled carrier gas to the precursor canister 107 through a second line 106. The precursor canister 107 may be utilized to supply a desired precursor to the semiconductor processing chamber 102 and may be located between a first valve 108 and a second valve 110 that may be used to isolate the precursor canister 107 from inflowing and outflowing streams. By isolating the precursor canister 107 from the process streams, the precursor canister 107 may be removed from the process, either physically or functionally, so that maintenance, replacing the precursor material, or other off-line work may be performed on the precursor canister 107 while it is not actively connected to the rest of the precursor delivery system 100. A third valve 112 may be connected between the second valve 110 and the semiconductor processing chamber 102 in order to make sure that atmospheric gases do not enter the semiconductor processing chamber 102 while the precursor canister 107 has been removed.

FIG. 2 illustrates in greater detail the precursor canister 107 between the flow controller 105 and the semiconductor processing chamber 102. The precursor canister 107 may comprise a chamber 201 with a vapor region 203 and a raw material region 205. In an embodiment a raw material 204 may be placed into the raw material region 205 of the chamber 201. Once in the raw material region 205 of the chamber 201, thermodynamic equilibrium may be used to drive portions of the raw material 204 into the gaseous phase and enter the vapor region 203 of the chamber 201, where it may be picked up and carried by the carrier gas from the flow controller 105 as the carrier gas flows around baffles 219 (discussed further below with respect to FIG. 3) located within the vapor region 203 of the chamber 201.

The chamber 201 may be any desired shape that may be suitable for vaporizing (if the raw material 204 is a liquid) or sublimating (if the raw material 204 is a solid) the raw material 204. In the embodiment illustrated in FIG. 2 and FIG. 3 (described below), the chamber 201 has a cylindrical sidewall and a bottom. However, the chamber 201 is not limited to a cylindrical shape, and any other suitable shape, such as a hollow square tube, an octagonal shape, or the like, may alternatively be utilized. Furthermore, the chamber 201 may be surrounded by a housing 207 made of material that is inert to the various process materials. As such, while the housing 207 may be any suitable material that can withstand the chemistries and pressures involved in the process, in an embodiment the housing 207 may be steel, stainless steel, nickel, aluminum, alloys of these, combinations of these, and like.

The chamber 201 may also have a lid 209 to enclose the chamber 201. The lid 209 may be attached to the housing 207 utilizing, e.g., a seal such as an o-ring, a gasket, or other sealant in order to prevent leakage from the chamber 201 while at the same time allowing the lid 209 to be removed for access to the chamber 201 within the interior of the housing 207. Alternatively, the lid 209 may be attached by welding, bonding, or adhering the lid 209 to the housing 207 in order to form an air-tight seal and prevent any leakage.

An inlet port 215 and an outlet port 217 may provide access to the chamber 201 in order to receive carrier gas from the flow controller 105 (see FIG. 1) and output a carrier gas/precursor gas mixture to the semiconductor processing chamber 102, respectively. The inlet port 215 and outlet port 217 may be formed in the lid 209 of the chamber 201 (as illustrated in FIG. 2) or may alternatively be formed through the sidewalls of the chamber 201. In an embodiment the inlet port 215 and outlet port 217 may also include various valves and fittings (not shown for clarity) to facilitate removal and replacement of the chamber 201.

The raw material region 205 may be utilized to store and prepare the raw material 204 from which a desired process gas may be formed. The raw material 204 may be any suitable raw material that can generate a process precursor in a gaseous form either through vaporization or sublimation. For example, if the raw material 204 is a solid material, the raw material 204 may sublimate from the solid phase to a gaseous phase or melt and then vaporize to a gaseous phase. Alternatively, if the raw material 204 is a liquid, the raw material 204 may simply vaporize to a gaseous phase.

In the embodiment wherein an ALD process is utilized to form a layer of TaN, the raw material 204 may be a solid material such as pentakis(dimethylamido) tantalum (PDMAT) and the raw material 204 may be placed within the raw material region 205 of the chamber 201. While the raw material 204 rests in the raw material region 205, the raw material 204 may sublimate to a gaseous form and accumulate within the vapor region 203 located over the raw material region 203. As such, the solid PDMAT may provide a process gas for the carrier gas to pick up and utilize in the semiconductor processing chamber 102 (as described in greater detail below).

However, as one of ordinary skill will recognize, utilization of solid PDMAT is not the only raw material 204 that is solid and that may be placed within the raw material region 205 of the chamber 201. Any solid precursor that may generate a gaseous process gas that may be used for any suitable semiconductor manufacturing process may also be utilized, and such solid precursors may include, e.g., xenon difluoride, nickel carbonyl, tungsten hexacarbonyl, and the like. These and any other suitable raw material 204 that is solid and that can generate a gaseous process precursor are fully intended to be included within the scope of the embodiments.

Furthermore, the scope of the embodiments is not intended to be limited to a raw material 204 that is solid as a raw material 204 of any suitable phase that may be used as a precursor material within a semiconductor manufacturing process may alternatively be placed within the raw material region 205. In other embodiments the raw material 204 may comprise a liquid raw material such as tetrakis (diethylamido) titanium (TDMAT), tertbutylimino tris(diethylamido) tantalum (TB TDET), pentakis(ethylmethylamido) tantalum (PE-MAT), and the like. These and any other suitable liquid raw materials that can generate a gaseous phase precursor are fully intended to be included within the scope of the embodiments.

A heater 213 controlled by a controller 211 (discussed further below with respect to FIG. 4) may be placed around the chamber 201 in order to adjust the thermodynamic equilibrium of the raw material 204 and help drive the raw material 204 into a gaseous phase and into the vapor region 203 of the chamber 201. The amount of the raw material 204 that may be transferred to the desired gaseous phase and the rate at which it may be transferred to the gaseous phase is related to the thermodynamic equilibrium and may be represented by a saturated vapor pressure of the raw material 204 itself. In the embodiment in which the raw material 204 is PDMAT, the initial saturated vapor pressure (P, in mmHg) of PDMAT may have the following relation to the temperature (T, in Kelvin) as expressed in Equation 1:

$$\text{Log}_{10} P_{(mmHg)} = 11.30 - \frac{4125}{T_{(K)}} \qquad \text{Eq. 1}$$

As illustrated, by increasing the temperature of the raw material 204, the saturated vapor pressure of the raw material 204 may be increased and more of the raw material 204 may be driven into the gaseous phase and the vapor region 203 of the chamber 201, thereby providing more gaseous process gas.

Additionally, the heater 213 may be configured to generate a temperature gradient within the chamber 201. For example, the heater 213 may be utilized to generate a temperature gradient with a higher temperature in the vapor region 203 and a lower temperature in the raw material region 205. As solid materials tend to condense back from the gaseous phase in colder regions of the chamber 201, this temperature gradient may be utilized to help any raw material 204 that phase changes back to a solid or liquid phase condense in the raw material region 205 instead of condensing in the vapor region 203. This helps to keep the vapor region 203 clear of condensing solids and liquids, thereby keeping more gaseous vapors in the vapor region 203.

The temperature gradient may be generated by configuring the heater 213 to generate more heat for the vapor region 203 and less heat for the raw material region 205. For example, in an embodiment in which the heater 213 is a resistive heater, the heater 213 may be configured to have a higher resistance adjacent to the vapor region 203, thereby leading to a larger generation of heat adjacent to the vapor region 203 than adjacent to the raw material region 205. In an embodiment the temperature gradient between the vapor region 203 and the raw material region 205 may be between about 5° C. and about 30° C., such as about 15° C. In a specific embodiment the heater 213 may be utilized to provide a temperature of about 73° C. to the raw material region 205 and a temperature of about 88° C. to the vapor region 203.

Additionally, the heater 213 may have temperature sensors 221 in order to provide heating information to the controller 211. The temperature sensors 221 may be, e.g., a thermocouple installed within the heater 213 to monitor the temperature of the heater 213 adjacent to the vapor region 203 and adjacent to the raw material region 205 of the chamber 201. However, any suitable type of sensor may alternatively be utilized to measure the temperature of the heater 213 and transmit that measurement to the controller 211.

Optionally, the chamber 201 may also include other heating and cooling devices (not shown) that may be utilized to help form the temperature gradient. For example, the chamber 201 may include a cooling plate located at the bottom of the chamber 201 to lower the temperature of the raw material region 205. Additionally, the first valve 108, the second valve 110, the inlet port 215, and the outlet port 217 may also be heated with, e.g., resistive heating tape or other heating elements. These and any other type of temperature controls are fully intended to be included within the scope of the embodiments.

FIG. 3 illustrates a top down view of the precursor canister 107 along line A-A' in FIG. 2 (with the outlet port 217 also shown using a dashed circle for clarity) and also illustrates a path that the carrier gas may travel through the vapor region 203 of the chamber 201. As illustrated, the vapor region 203 may also contain a number of the baffles 219 that may be designed to form a longer flow path for the carrier gas through the vapor region 203 of the chamber 201 than a straight line between the inlet port 215 and the outlet port 217. By forming a longer flow path, the baffles 219 may also cause the carrier gas to have a longer residence time within the vapor region 203 of the chamber 201, thereby also increasing the amount of gaseous precursor gas that the carrier gas will pick-up and "carry" out the outlet port 217 and to the semiconductor processing chamber 102.

The precise number and shape of the baffles 219 and the carrier gas flow path through the vapor region 203 may be selected to control the vaporization/sublimation and the flow of the gaseous precursor material. For example, more baffles 219 may be installed to form a longer path through the vapor region 203, thereby causing the carrier gas to have a faster speed through the vapor region 203, or the specific shape of the baffles 219 may be designed to affect the vaporization/sublimation of the raw material 204 and help to control the usage of the raw material 204, allowing for more control of the usage of the raw material 204. As such, while five baffles 219 are illustrated in FIG. 3 as an illustrative embodiment, there could be any number and shape of baffles 219 while still remaining within the scope of the embodiments.

The baffles 219 may be attached to the housing 207 or lid 209 of the chamber 201, or may alternatively be a stand-alone insert that may be separately placed within the chamber 201. Additionally, the baffles 219 may be placed so as to extend into the raw material region 205 and also to prevent the flow of materials (e.g. the carrier gas and the raw material 204 in a gaseous phase) between the baffles 219 and the lid 209 of the chamber 201. Such a placement will cause the carrier gas and raw material 204 to flow between the baffles 219 instead of over or around the baffles 219.

FIG. 4 illustrates in greater detail an embodiment of the controller 211 that may be utilized to control the heater 213 and, through the heater 213, control the saturated vapor pressure of the raw material 204 in the vapor region 203 of the chamber 201. The controller 211 may be any form of computer processor that can be used in an industrial setting for controlling process machines or may alternatively be a general purpose computer platform programmed for such control of industrial machines. In an embodiment the controller 211 may comprise a processing unit 401, such as a desktop computer, a workstation, a laptop computer, or a dedicated unit customized for a particular application. The controller 211 may be equipped with a display 403 and one or more input/output components 405, such as sensor inputs, a mouse, a keyboard, printer, combinations of these, or the like. The processing unit 401 may include a central processing unit (CPU) 406, memory 408, a mass storage device 410, a video adapter 414, and an I/O interface 416 connected to a bus 412.

The bus 412 may be one or more of any type of several bus architectures including a memory bus or memory controller, a peripheral bus, or video bus. The CPU 406 may comprise any type of electronic data processor, and the memory 408 may comprise any type of system memory, such as static random access memory (SRAM), dynamic random access memory (DRAM), or read-only memory (ROM). The mass storage device 410 may comprise any type of storage device configured to store data, programs, and other information and to make the data, programs, and other information accessible via the bus 412. The mass storage device 410 may comprise, for example, one or more of a hard disk drive, a magnetic disk drive, or an optical disk drive.

The video adapter 414 and the I/O interface 416 provide interfaces to couple external input and output devices to the processing unit 401. As illustrated in FIG. 4, examples of input and output devices include the display 403 coupled to the video adapter 414 and the I/O component 405, such as sensors (e.g., the temperature sensors 221, see FIG. 2), a mouse, keyboard, printer, and the like, coupled to the I/O interface 416. Other devices may be coupled to the processing unit 401, and additional or fewer interface cards may be utilized. For example, a serial interface card (not shown) may be used to provide a serial interface for a printer. The processing unit 401 also may include a network interface 418 that may be a wired link to a local area network (LAN) or a wide area network (WAN) 420 and/or a wireless link.

It should be noted that the controller 211 may include other components. For example, the controller 211 may include power supplies, cables, a motherboard, removable storage media, cases, and the like. These other components, although not shown in FIG. 4, are considered part of the controller 211.

Operationally, the controller 211 may be utilized to control the heater 213. For example, when the raw material 205 is initially placed in the raw material region 205 of the chamber 201 (and before any degradation or deterioration has occurred), the controller 211 may control the heater 213 so as to set the temperature of the heater 213 (and, through a transfer of heat through the housing 207, the temperature of the chamber 201) to a desired temperature. In an embodiment which utilizes PDMAT, the desired temperature may be determined in part from the initial saturated vapor pressure equation detailed above with respect to Equation 1. For example, in the embodiment utilizing PDMAT, the controller 211 may set the heater 213 to have a temperature gradient, with the temperature adjacent to the vapor region 203 being between about 85° C. and about 95° C., such as about 88° C., while the temperature adjacent to the raw material region 205 being between about 68° C. and about 79° C., such as about 73° C. However, the precise temperatures may vary depending upon the material used, the initial vapor pressure, and the desired flow rate of raw material 204 desired.

Additionally, the controller 211 may also be configured to automatically tune the temperature (and thereby adjust the saturated vapor pressure of the raw material 204) in order to compensate for any degradation and deterioration that may occur over long term, repeated use of the raw material 204. In an embodiment, as the saturated vapor pressure of the raw material 204 decreases at a particular temperature because of deterioration and degradation, the controller 211 may automatically compensate for the reduced saturated vapor pressure by increasing the process temperature and raising the lowered initial saturated vapor pressure of the raw material 204. By raising the saturated vapor pressure through the temperature, the desired concentration of raw material 204 within the vapor region 203 and, subsequently, the semiconductor processing chamber 102, may be obtained and kept consistent throughout the life span of the raw material 204.

The controller 211 may automatically adjust the temperature of the heater 213 and adjust the saturated vapor pressure of the raw material 204 in a number of methods. In a first embodiment a calibration curve may be generated and then implemented within the controller 211. In this embodiment an initial sample of raw material 204 may be placed within the chamber 201 and used over its life span without compensation from the controller 211. By allowing the initial sample of raw material 204 to degrade and deteriorate, an indication of the saturated vapor pressure of the initial sample of raw material 204 may be taken each time the initial sample of raw material 204 is used, and the degradation and deterioration can be charted as the calibration curve.

FIG. 5A illustrates such a calibration curve in which solid PDMAT is utilized as the initial sample of raw material 204. In this type of calibration curve, the indications of the saturated vapor pressure are samples of the vapor pressure or concentration of the raw material 204 taken from the vapor region 203 while the initial sample of raw material 204 was in use. In this calibration curve, a normalized indication of the vapor pressure is illustrated on the y-axis and a normalized number of runs is illustrated on the x-axis.

Figure 5B:
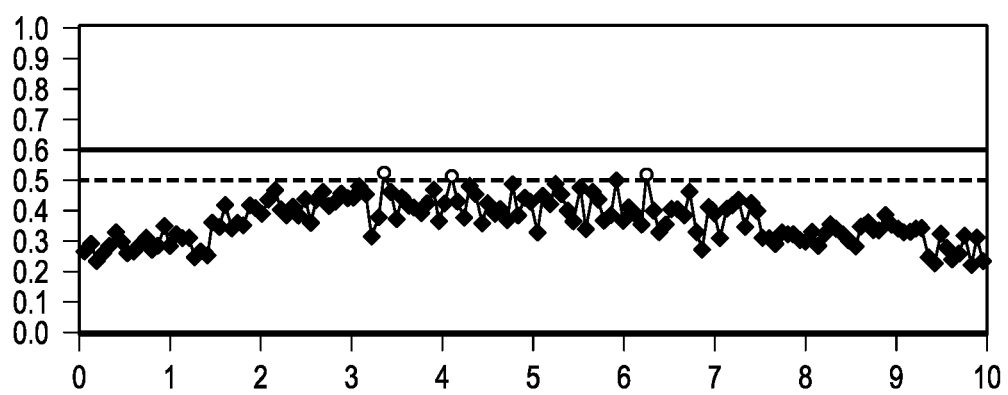

However, the calibration curve is not limited to be generated by measuring the vapor pressure of the raw material 204. Any other suitable indication of saturated vapor pressure may alternatively be utilized. FIG. 5B illustrates another calibration curve which may be generated using another indication of saturated vapor pressure: the variation of the semiconductor wafers 104 that are formed during the processes. As a reduced saturated vapor pressure leads to a reduced mass flow of precursor material, which in turn can lead to a greater variation in thickness, a larger variation in thickness of a layer may be utilized as an indication that the saturated vapor pressure is being degraded. Given this, the calibration curve may also be generated by utilizing the initial raw sample of raw material 204 to form layers on the semiconductor wafer 104 (or series of semiconductor wafers 104), and then measuring the variation of the thicknesses of these layers. These data points may then be charted as illustrated in FIG. 5B (using normalized data for the thickness variations and wafers) to generate the calibration curve, with the variability only decreasing after the raw material 204 has been replaced, such as after 2000 liters.

After the calibration curve has been generated from the actual usage of the initial sample of raw material 204, the calibration curve may be then be input and stored into the controller 211, which may then use the calibration curve to adjust the heater 213 for subsequent samples of the raw material 204. For example, if similar material and process conditions are utilized for subsequent samples of the raw material 204, then the controller may, from the calibration curve, known when and how much the saturated vapor pressure of the raw material 204 has deteriorated from the initial saturated vapor pressure equation (see, e.g., Equation 1). With the calibration curve, the controller 211 may automatically adjust the temperature of the heater 213 in order to compensate for the deterioration and degradation. For example, as the saturated vapor pressure of the raw material 204 deteriorates from usage, the controller 211 may, based on the calibration curve, sequentially increase the temperature of the heater 213 between about 0.5° C. and about 10° C., such as an increase over the life span of the raw material 204 of about 5° C. In an embodiment in which the temperature gradient for PDMAT is initially set at 88° C.-73° C., the controller 211, based on the calibration curve, may sequentially increase the temperature gradient about 5° C., to about 93° C.-78° C., at the end of the life span of the raw material 204.

Figure 6:
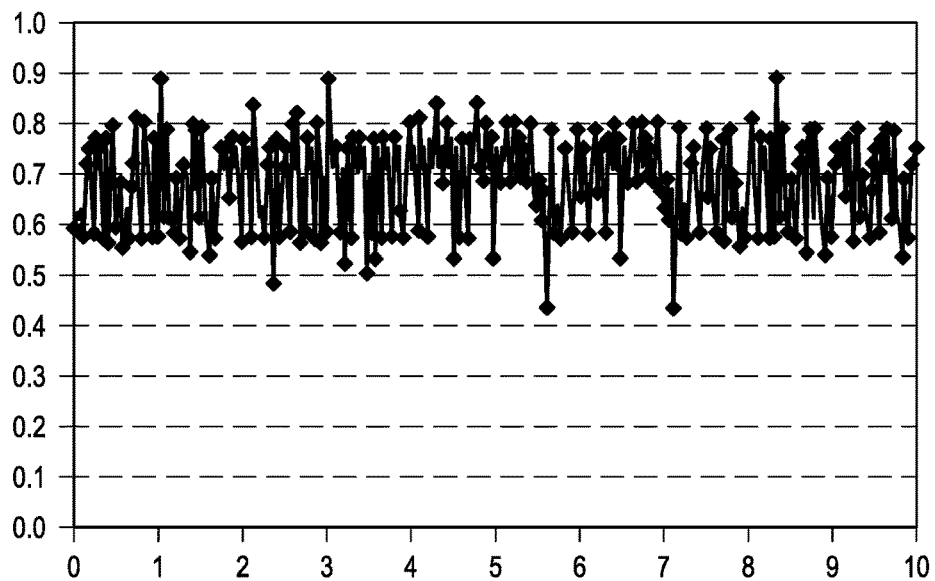
FIG. 6 illustrates a verification curve which may be used to verify the calibration curve in accordance with an embodiment.

Optionally, after the calibration curve has been generated and implemented within the controller 211, the calibration curve may be verified during subsequent manufacturing processes by generating a verification curve such as the verification curve illustrated in FIG. 6. For example, the verification curve may be generated by utilizing similar measurements of an indication of saturated vapor pressure as those described above (e.g., measuring the vapor pressure or concentration or measuring a variation of the thickness of a layer formed from the raw material 204). These indications of saturated vapor pressure may be charted and, if the indications of saturated vapor pressure remain consistent over the life span of the raw material 204, as illustrated in FIG. 6, the calibration curve may be verified. If the indications of saturated vapor pressure do not remain consistent, modifications to the calibration curve may be made.

By having the controller 211 utilize the calibration curve, the variation in saturated vapor pressure caused by deterioration and degradation of the raw material 204 may be avoided. As such, a more constant concentration of the raw material 204 may be generated over the life span of the raw material 204 in the vapor region 203 of the chamber 201, and a more even flow of the raw material 204 may be presented to the semiconductor processing chamber 102. By having a more consistent concentration variations in the thickness of the layers formed on the semiconductor wafer 104 may be reduced, leading to more consistent layers and less chances for problems to occur during the manufacturing of the semiconductor wafer 104.

Figure 7:
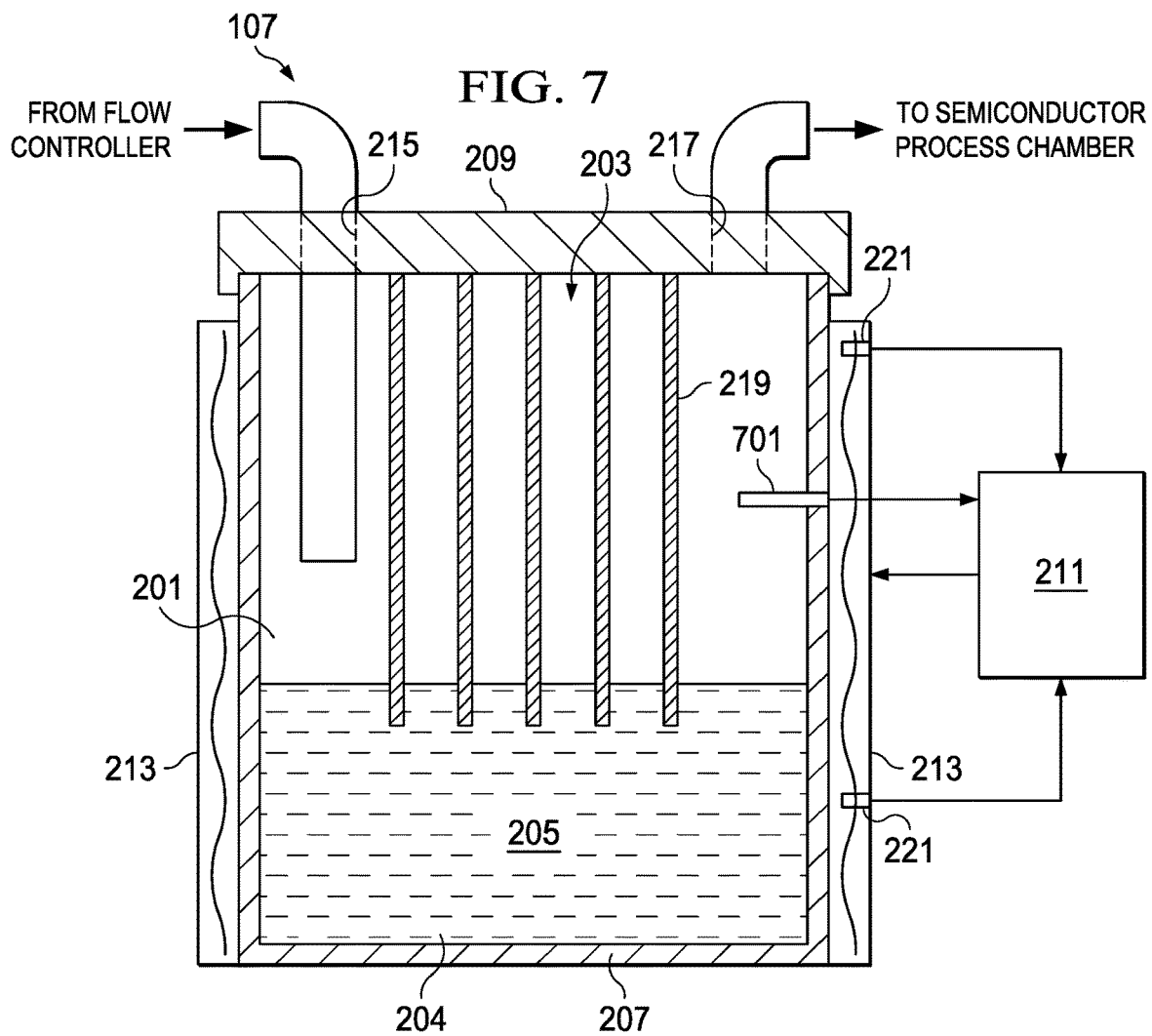
FIG. 7 illustrates another embodiment that uses a real-time sensor to control the temperature within the precursor canister in accordance with an embodiment.

FIG. 7 illustrates another embodiment in which the controller 211 may adjust the temperature of the heater 213 based on a real-time sensor 701 instead of a calibration curve. In this embodiment the real-time sensor 701 may be installed such that it samples the vapor pressure or concentration of the raw material 204 within the vapor region 203 of the chamber 201 and immediately relays that information to the controller 211. The real-time sensor 701 may, e.g., be an optical sensor that can measure a concentration by measuring a reduction in optical radiation (e.g., infrared or ultraviolet radiation) due to the absorption of the radiation by the raw material 204 in the gaseous form. However, any suitable real-time sensor may alternatively be utilized to measure the concentration of the raw material 204 as a real-time indication of the saturated vapor pressure of the raw material 204.

Once a real-time measurement has been taken by the sensor 701, the measurement may be relayed to the controller 211. The controller 211 may take this measurement and compare it to a desired value to determine if there is any deterioration or degradation that has occurred. If deterioration or degradation has occurred, the controller 211 may adjust the temperature of the heater 213 to compensate for the deterioration or degradation. Subsequent readings from the sensor 701 may be compared to the desired value in order to see if further adjustments may be desired.

In accordance with an embodiment, a method of manufacturing a semiconductor device includes applying a first amount of heat to a vapor region of a precursor canister, measuring an indication of saturated vapor pressure within the vapor region during the applying the first amount of heat, and applying a second amount of heat to the vapor region of the precursor canister, the second amount of heat being adjusted from the first amount of heat based on the indication of saturated vapor pressure.

In accordance with another embodiment, a method includes placing a first wafer into a semiconductor processing chamber and performing a first process on the first wafer. Performing the first process includes heating a first supply of precursor material to a first temperature in a precursor canister and measuring a first indication of saturated vapor pressure in a vapor region of the precursor canister. The method also includes placing a second wafer into the semiconductor processing chamber and performing a second process on the second wafer. Performing the second process includes heating a second supply of precursor material to a second temperature in the precursor canister, wherein the second temperature is determined from the first indication of saturated vapor pressure.

In accordance with yet another embodiment, a method includes performing a first series of processes on first multiple semiconductor wafers, measuring multiple indications of saturated vapor pressure of a first supply of precursor material during the first series of processes, and performing a second series of processes on second multiple semiconductor wafers. The second series of processes includes heating a second supply of precursor material to multiple temperatures, wherein the multiple temperatures are determined from the multiple indications of saturated vapor pressure of the first supply of precursor material.

Although the embodiments and their advantages have been described in detail, it should be understood that various changes, substitutions and alterations can be made herein without departing from the spirit and scope of the embodiments as defined by the appended claims. For example, the heater may be a resistive heater or a steam heater. Additionally, any type of indication of that may be utilized to provide a description of the saturated vapor pressure may alternatively be measured.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing a semiconductor device, the method comprising:
performing a first deposition process to deposit a first material layer on a first semiconductor wafer, the first deposition process comprising:
placing a first supply of a precursor material into a precursor canister connected to a process chamber;
placing the first semiconductor wafer into the process chamber;
applying a first amount of heat to a vapor region of the precursor canister while the precursor canister contains the first supply of the precursor material; and
measuring a first indication of saturated vapor pressure within the vapor region during the applying the first amount of heat; and
after performing the first deposition process, performing a second deposition process to deposit a second material layer on a second semiconductor wafer, the second deposition process comprising:
placing a second supply of the precursor material into the precursor canister;
placing the second semiconductor wafer into the process chamber; and
applying a second amount of heat to the vapor region of the precursor canister while the precursor canister contains the second supply of the precursor material, the second amount of heat being adjusted from the first amount of heat based on the first indication of saturated vapor pressure.

2. The method of claim 1, further comprising generating a calibration curve from the first indication of saturated vapor pressure.

3. The method of claim 1, wherein the first indication of saturated vapor pressure is a measured thickness of the first layer on the first semiconductor wafer.

4. The method of claim 1, wherein the first indication of saturated vapor pressure is a measurement of vapor pressure within the vapor region of the precursor canister.

5. The method of claim 1, wherein the first indication of saturated vapor pressure is a real-time measurement of vapor pressure within the precursor canister.

6. The method of claim 1, wherein the applying a first amount of heat further comprises applying a first voltage to a resistive heater.

7. A method comprising:
placing a first wafer into a semiconductor processing chamber;
performing a first process on the first wafer, wherein performing the first process comprises:
heating a first supply of precursor material to a first temperature in a precursor canister;
measuring a first indication of saturated vapor pressure in a vapor region of the precursor canister; and
removing the first wafer from the semiconductor processing chamber;
after performing the first process on the first wafer, placing a second wafer into the semiconductor processing chamber; and
performing a second process on the second wafer, wherein performing the second process comprises:
heating a second supply of precursor material to a second temperature in the precursor canister, wherein the second temperature is determined from the first indication of saturated vapor pressure.

8. The method of claim 7, wherein the second supply of precursor material is the same type of material as the first supply of precursor material.

9. The method of claim 7, further comprising generating a calibration curve based at least in part on the first indication of saturated vapor pressure.

10. The method of claim 7, wherein the first supply of precursor material is at least partially in a solid phase.

11. The method of claim 7, wherein the first process is a deposition process.

12. The method of claim 7, wherein the second temperature is different than the first temperature.

13. The method of claim 7, wherein the first indication of saturated vapor pressure is a concentration measurement from a concentration sensor.

14. The method of claim 7, further comprising:
placing a third wafer into the semiconductor processing chamber; and
performing a third process on the third wafer, wherein performing the third process comprises:
heating the first supply of precursor material to a third temperature in the precursor canister; and
measuring a second indication of saturated vapor pressure in the vapor region of the precursor canister.

15. The method of claim 14, further comprising:
after performing the first process on the first wafer, placing a fourth wafer into the semiconductor processing chamber; and
performing a fourth process on the fourth wafer, wherein performing the fourth process comprises:
heating the second supply of precursor material to a fourth temperature in the precursor canister, wherein the fourth temperature is determined from the second indication of saturated vapor pressure.

16. A method comprising:
performing a series of first deposition processes on a first plurality of semiconductor wafers, wherein each first deposition process of the series of first deposition processes comprises:
placing one or more semiconductor wafers of the first plurality of semiconductor wafers in a processing chamber;
heating a first supply of a precursor material; and
measuring one or more indications of saturated vapor pressure of the first supply of the precursor material during the heating of the first supply of the precursor material; and
performing a series of second deposition processes on a second plurality of semiconductor wafers, wherein each second deposition process of the series of second deposition processes comprises:
placing one or more semiconductor wafers of the second plurality of semiconductor wafers in the processing chamber; and
heating a second supply of the precursor material to one or more temperatures, wherein each of the one or more temperatures is determined from at least one of the indications of saturated vapor pressure of the first supply of the precursor material.

17. The method of claim 16, further comprising generating a calibration curve from the indications of saturated vapor pressure of the first supply of the precursor material, wherein the one or more temperatures of each second deposition process are determined from the calibration curve.

18. The method of claim 17, further comprising verifying the calibration curve by measuring a plurality of indications of saturated vapor pressure of the second supply of the precursor material during the series of second deposition processes.

19. The method of claim 16, wherein the indications of saturated vapor pressure of the first supply of precursor material are measurements of vapor pressure within a precursor canister that contains the first supply of the precursor material.

20. The method of claim 19, wherein the indications of saturated vapor pressure of the first supply of precursor material are measurements of vapor pressure within a raw material region of the precursor canister.

* * * * *